July 26, 1960 T. A. NALETTE ET AL 2,946,877

PRINTED CIRCUIT ARTICLE

Filed Feb. 14, 1958 2 Sheets-Sheet 1

Thomas A. Nalette

Harold W. Lalmond

*INVENTORS*

Thomas A. Nalette
Harold W. Lalmond
*INVENTORS*

United States Patent Office 2,946,877
Patented July 26, 1960

2,946,877

PRINTED CIRCUIT ARTICLE

Thomas A. Nalette, East Pepperell, Mass., and Harold W. Lalmond, Nashua, N.H., assignors to Sanders Associates, Inc., Nashua, N.H., a corporation of Delaware Filed Feb. 14, 1958, Ser. No. 715,273

8 Claims. (Cl. 200—166)

The present invention relates to printed circuit articles, such as flexible cabling utilizing copper conductors bonded to a wide range of plastic materials. More particularly, this invention relates to flexible printed circuit cable terminations.

Typically, flexible printed circuit cables are formed from flat, relatively thin sheets of plastic material having embedded therein flat, thin conductors all in the same plane or, at most, in a few superimposed planes. In one form of such a cable, the conductors are of uniform width and are separated uniformly. The present invention is directed to an improvement in such printed circuits by providing a solution for the problems arising from wiring and soldering connections to a wide range of electrical apparatus. In the past, the wiring of electrical systems having a number of connections, such as, for example, switches, required the wire to be stripped, bent around the terminals, and soldered. Then too, in complicated systems it is difficult to avoid wiring errors. Many of these problems have been simplified to some extent by the use of printed circuit techniques which provide preconnected assemblies. Such printed circuits generally take the form of relatively rigid dielectric boards having conductors bonded to one or more surfaces thereof. While such an arrangement is suitable for certain electrical and electronic applications, it cannot be used to replace conventional wiring where length and flexibility are essential.

It is, therefore, an object of the present invention to provide an improved flexible printed circuit article adapted for simplified engagement with the terminals of an electrical component.

It is a further object of this invention to provide an improved flexible, printed circuit cable.

Yet another object of this invention is to provide an improved flexible, printed circuit cable having a planar terminal configuration.

In accordance with the present invention there is provided a printed circuit article comprising a flat, flexible, plastic printed circuit having embedded therein a plurality of planar conductors with terminals integrally formed therewith. The cable has a slot and aperture therein whereby the printed circuit article is adaptable for coupling to the rotor shaft of a rotary switch. In addition, a wafer switch having terminals thereon for coupling with said conductor terminals is provided. The wafer switch includes a rotor shaft having a member thereon adapted, upon rotation of the shaft to contact selected terminals on the wafer.

In accordance with another embodiment of the invention there is provided a printed circuit article, comprising a flat, flexible plastic printed circuit cable. The printed circuit cable has a plurality of conductors embedded therein an upper and lower plane. There is also provided a connector having a row of terminals in each of two planes. The connector terminals are adapted for engagement with the cable conductors on both of the planes at one end of the cable. In addition, a rotary switch is provided having a high terminal density. The cable conductors in the upper conductor plane has terminals adapted to engage simultaneously some of the switch terminals when superimposed thereon. The cable conductors in the lower conductor plane have terminals divided longitudinally to form two terminal groups. Each of the terminal groups in the lower conductor plane is adapted to being folded around and over the conductors of the upper conductor plane and on to the remaining terminals of the switch.

As used herein, the term "plastic" includes a synthetic organic material of high molecular weight and which, while solid in the finished state, at some stage in its manufacture is soft enough to be formed into shape by some degree of flow. The well-known term "Kel-F" as used herein is the trademark of the M. W. Kellogg Company and refers to the plastic polymer tri-fluoro-chloro-ethylene as manufactured by them.

The well-known term "Teflon" as used herein is the trademark of the E I. du Pont de Nemours & Company, Inc. and refers to the plastic polymer tetra-fluoro-ethylene as manufactured by them. The term "ethylene" includes all those plastic materials containing an ethylene radical and the term "vinyl" includes all those plastic materials containing a vinyl radical. The term "Saran," trademark of the Dow Chemical Company, is used herein to denote those plastic materials containing a vinylidine radical. The term "nylon" as used herein refers generically to the group of plastic materials known as polyamides.

For a better understanding of the present invention, together with other and further objects thereof, reference is made to the following description taken in connection with the accompanying drawings and its scope will be pointed out in the appended claims.

Figure 1:
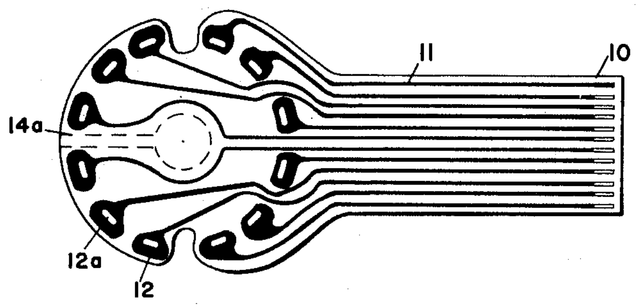
Fig. 1 is a plan view of a printed circuit cable embodying the terminal configuration of the present invention.
Figure 2:
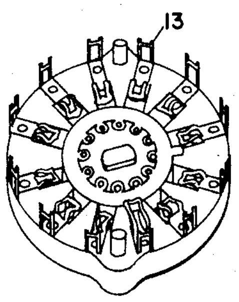
Fig. 2 is a perspective view of a rotary switch part, illustrating a typical terminal arrangement.

Referring now to Fig. 1 of the drawings, there is here shown a flat, flexible printed circuit cable 10 having conductors 11 and terminals 12. The planar configuration of the terminals 12 is congruent with the terminals of an electrical component which, for convenience, is illustrated as a wafer type rotary switch. The typical, generally circular arrangement of the terminals 13 of a rotary switch is shown specifically in Fig. 2. An important feature of the invention lies in the conductor and terminal configuration of the cable 10. Here, the parallel conductors 11 fan out to form the generally circular terminal configuration illustrated. Each terminal 12 is completely bared on the upper surface of any insulation and oxide deposit to facilitate soldering. The terminals 12 are also equipped with slots 12_a_ to provide an initial mechanical engagement with the switch terminals 13. The terminals 12 are arranged congruently with the terminals 13 of the rotary switch. In this manner the cable terminals 12 are adapted simultaneously to engage the switch terminals 13 when superimposed thereon. This same cable terminal configuration, as illustrated in Fig. 1, may be used in the plural to accommodate a multiple wafer rotary switch as more particularly illustrated in Fig. 3. Here the terminals 12 of the cable are shown in engagement with the terminals 13 of the switch. In order to accommodate the rotor shaft 14 of the switch 15, the terminal area of the cable 10 is cut along the dashed lines 14_a_, shown in Fig. 1. This creates a slot and aperture that enables the cable end to be spread to receive the rotor shaft 14 when superimposing the conductor terminals 12 on the switch terminals 13. After positioning the conductor terminals 12 on to the switch terminals 13, the conductor terminals 12 may be secured to, and brought into permanent electrical contact with, the switch terminals 13 by means of solder. The solder may be either manually applied or applied with the use of dip or fountain soldering techniques.

Figure 3:
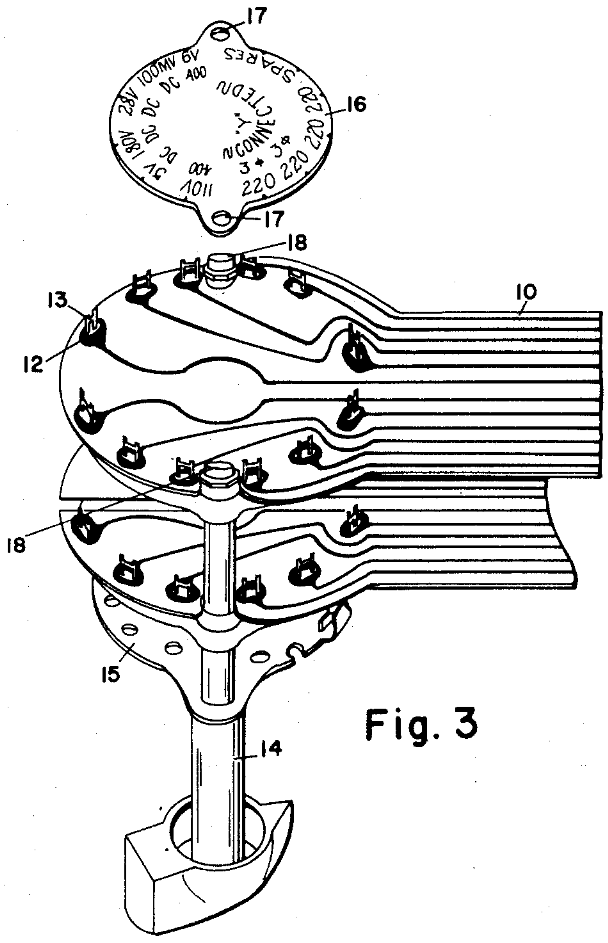
Fig. 3 is a perspective view of a multiple wafer rotary switch and printed circuit cable termination embodying the present invention.

The arrangement illustrated in Fig. 3 is desirable as it inhibits the wiring errors that may occur with the use of independent conductors. It has the additional features of saving space, affording greater flexibility and giving a neater appearance. Then too, the functions of the individual conductors of the cable may be indicated at each terminal by printing the same on the plastic cover insulation, or by using an overlay 16, designed with holes 17 to be secured to the retaining studs 18 of the rotary switch 15 as indicated in Fig. 3.

Figure 4:
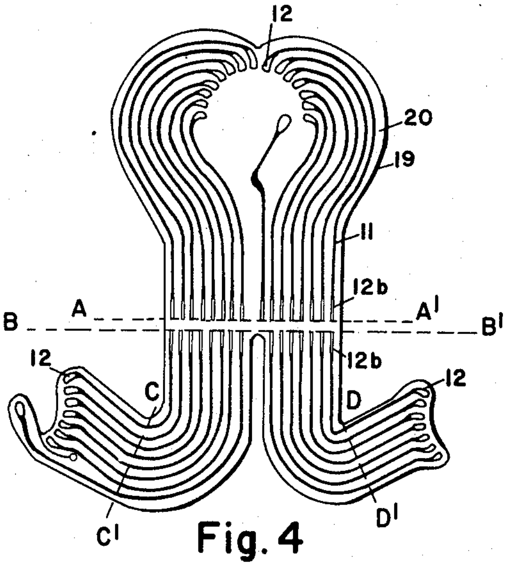
Fig. 4 is a plan view of a printed circuit cable, before assembly, having a terminal configuration from which another embodiment of the present invention is formed.

Referring now to Fig. 4, there is here illustrated a printed circuit 19 of a plurality of conductors 11 encapsulated in a plastic insulating material 20. This printed circuit 19 is formed initially in a single piece from a sheet of plastic, copper clad on one side. After forming the conductors 11 in the configuration shown, the process for which will be more fully explained hereinafter, the printed circuit is cover coated with insulation except in the vicinity of the terminals 12 and 12_b_. Folds are then made along lines A—A$^1$, B—B$^1$, C—C$^1$, and D—D$^1$ to form the embodiment of Fig. 5. If desired, the folded cable may then be permanently laminated in the folded position to fix the terminal arrangement. Fig. 6 more especially illustrates the engagement of the conductor terminals 12, of the embodiment of Fig. 5, with the terminals 13 of a high terminal density rotary switch 21.

Figure 5:
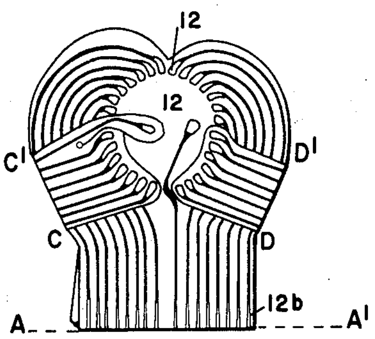
Fig. 5 is a plan view of the embodiment formed from the printed circuit cable in Fig. 4.
Figure 6:
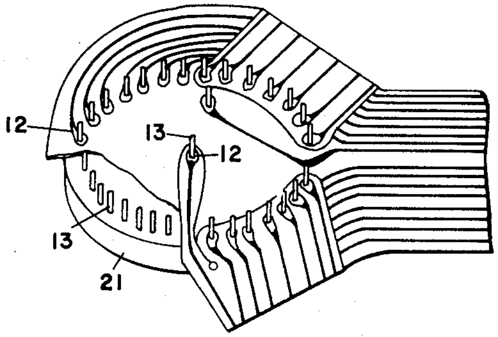
Fig. 6 is a perspective view of a terminal arrangement illustrating the positioning of the embodiment of Fig. 5 onto a rotary switch of high terminal density.
Figure 7:
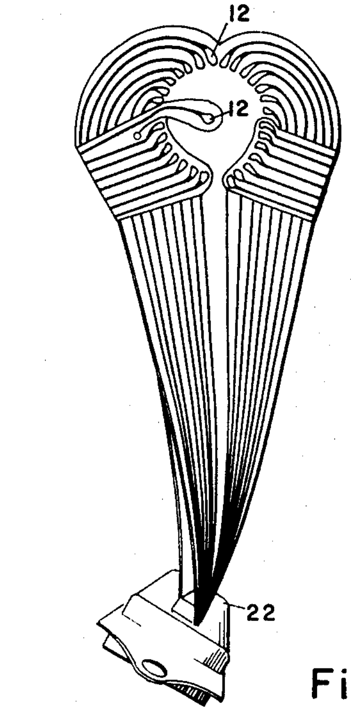
Fig. 7 is a perspective view of the embodiment of Fig. 5 illustrating its use with a two plane, multiple conductor connector.

Another application of the embodiment of Fig. 5 is illustrated in Fig. 7. Here the two layers or planes of conductors are used in combination with a micro-ribbon connector 22, such as the Amphenol 57 series of connectors manufactured by the Amphenol Electronics Corporation of Cicero, Illinois.

Figure 8:
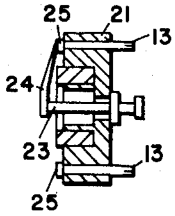
Fig. 8 is a side elevational view, in section, of a typical rotary commutator switch.

Illustrated in Fig. 8 is an elevational view in section of a typical rotary switch 21 showing the terminals 13, the shaft 23, the commutator arm 24, and the terminal contact buttons 25.

Figure 9:
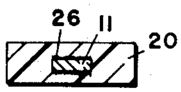
Fig. 9 is an elevational view in cross-section of a cable conductor.

While applicant does not intend to be limited to any particular materials in the manufacture of the article of this invention, the combination of copper conductors with poly-tri-fluoro-chloro-ethylene insulation has been found to be particularly useful. For example, the printed circuit cable may be formed from 1 ounce (1.37 mil) copper conductors having an adherent coating of black cupric oxide formed by oxidation in a chemical bath. These conductors are then readily laminated between two to five mil (0.002–0.005 of an inch) sheets of poly-tri-fluoro-chloro-ethylene. Fig. 9 particularly illustrates the laminate structure, showing in cross-section the copper conductor 11, the cupric oxide coating 26, and the poly-tri-fluoro-chloro-ethylene insulation 20. Other plastic materials that have been successfully employed to produce the article of this invention include polyethylene, Teflon, polyvinyl acetate, and polyvinyl chloride. However, as stated above, it is believed that this principle applies broadly to all plastics and applicant does not intend to be limited to those cited in the examples.

While there has been described what are at present considered to be the preferred embodiments of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. A printed circuit article, comprising: a flat, flexible, plastic, printed circuit cable having embedded therein a plurality of conductors in an upper and a lower plane, said conductors having an adherent coating of black cupric oxide produced by oxidation in a chemical bath; a connector having a row of terminals in each of two planes, said connector terminals being adapted for engagement with said cable conductors of both of said planes at one end of said cable; and a rotary wafer switch having a high terminal density, said cable conductors in said upper conductor plane having terminals adapted to engage simultaneously some of said switch terminals when superimposed thereon and said cable conductors in said lower conductor plane having terminals divided longitudinally to form two terminal groups, each of said terminal groups adapted to being folded around and over the conductors of said upper conductor plane and onto the remaining terminals of said switch.

2. A printed circuit article, comprising: a flat, flexible, plastic, printed circuit cable having embedded therein a plurality of conductors in an upper and a lower plane; a connector having a row of terminals in each of two planes, said connector terminals being adapted for engagement with said cable conductors of both of said planes at one end of said cable; and a rotary wafer switch having a high terminal density, said cable conductors in said upper conductor plane having terminals adapted to engage simultaneously some of said switch terminals when superimposed thereon and said cable conductors in said lower conductor plane having terminals divided longitudinally to form two terminal groups, each of said terminal groups adapted to being folded around and over the conductors of said upper conductor plane and on to the remaining terminals of said switch.

3. A printed circuit article, comprising: a flat, flexible, plastic, printed circuit cable having embedded therein a plurality of conductors in an upper and a lower plane; and a rotary wafer switch having a high terminal density, said cable conductors in said upper conductor plane having terminals adapted to engage simultaneously some of said switch terminals when super-imposed thereon and said cable conductors in said lower conductor plane having terminals divided longitudinally to form two terminal groups, each of said terminal groups adapted to being folded around and over the conductors of said upper conductor plane and on to the remaining terminals of said switch.

4. A printed circuit article comprising: a flat, flexible, plastic printed circuit cable having embedded therein a plurality of planar conductors, said conductors having terminals integrally formed therewith, and said cable having a slot and aperture therein for adapting said cable to a rotor shaft; and a wafer switch including a wafer layer having terminals thereon for coupling with said conductor terminals and said rotor shaft having a member thereon adapted, upon rotation of said shaft to contact selected terminals on said wafer.

5. A printed circuit article, comprising: a flat, flexible, plastic printed circuit cable having embedded therein a plurality of planar conductors, said conductors, having terminals substantially circumferentially disposed and integrally formed therewith, and said cable having a slot and aperture therein whereby said printed circuit article is adaptable for coupling with a rotary switch having terminals substantially circumferentially disposed and a rotatable shaft member.

6. A printed circuit article, comprising: a flat, flexible, plastic printed circuit having embedded therein a plurality of planar conductors, said conductors having terminals in a desired configuration integrally formed therewith, said cable having a slot and aperture therein for adapting said cable to a rotor shaft; and a wafer switch including a wafer layer having terminals thereon in said desired configuration for coupling with said conductor terminals, and a rotor shaft having a member thereon adapted, upon rotation of said shaft, to contact selected terminals on said wafer.

7. A printed circuit article, comprising: a flat, flexible, plastic, printed circuit cable having embedded therein a plurality of planar conductors, said conductors having terminals substantially circumferentially disposed integrally formed therewith, said cable having a slot and aperture therein for adapting said cable to a rotor shaft; and a wafer switch including a wafer layer having terminals substantially circumferentially disposed thereon for coupling with said conductor terminals, and a rotor shaft having a rotor thereon adapted upon rotation of said shaft to contact selector terminals upon said wafer.

8. A printed circuit article, comprising: a flat, flexible, plastic printed circuit cable having embedded therein a plurality of planar conductors having terminals in a desired configuration integrally formed therewith, and said cable having a slot and aperture therein whereby said printed circuit article is adaptable for coupling with a rotary switch having terminals in said desired configuration, and a rotatable shaft member.

References Cited in the file of this patent

UNITED STATES PATENTS

| | | |
|---|---|---|
| 2,616,994 | Luhn | Nov. 4, 1952 |
| 2,649,513 | Luhn | Aug. 18, 1953 |
| 2,694,999 | Sullivan | Nov. 23, 1954 |
| 2,695,351 | Beck | Nov. 23, 1954 |
| 2,841,660 | Tabet | July 1, 1958 |
| 2,847,523 | Van Amelsfort | Aug. 12, 1958 |
| 2,854,502 | Richter | Sept. 30, 1958 |